United States Patent
Song et al.

(10) Patent No.: US 7,829,951 B2
(45) Date of Patent: Nov. 9, 2010

(54) METHOD OF FABRICATING A FIN FIELD EFFECT TRANSISTOR (FINFET) DEVICE

(75) Inventors: Seung-Chul Song, Austin, TX (US); Mohamed Hassan Abu-Rahma, San Diego, CA (US); Beom-Mo Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/266,183

(22) Filed: Nov. 6, 2008

(65) Prior Publication Data

US 2010/0109086 A1    May 6, 2010

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/365; 257/401; 257/E21.421; 257/E29.264

(58) Field of Classification Search ................. 257/365, 257/401, E21.421, E29.264
See application file for complete search history.

(56) References Cited

U.S. PATENT DOCUMENTS

| | | |
|---|---|---|
| 6,872,647 B1 | 3/2005 | Bin |
| 6,924,560 B2 | 8/2005 | Wang et al. |
| 6,951,784 B1 | 10/2005 | Anderson |
| 7,138,305 B2 | 11/2006 | Datta et al. |
| 2004/0262698 A1 | 12/2004 | Nowak |
| 2005/0094434 A1 | 5/2005 | Watanabe |
| 2005/0023925 A1 | 10/2005 | Chi et al. |
| 2007/0063276 A1 | 3/2007 | Beintner |
| 2007/0170521 A1 | 7/2007 | Abadeer |

(Continued)

FOREIGN PATENT DOCUMENTS

JP    2008117816    5/2008

(Continued)

OTHER PUBLICATIONS

Matsukawa,Takashi et al, "Dual Metal Gate FinFET Integration by Ta/Mo Diffusion Technology for Vt Reduction and Multi-Vt CMOS Application," 2008 IEEE 978-1-4244-2364-4/08, p. 282.

(Continued)

*Primary Examiner*—David S Blum
(74) *Attorney, Agent, or Firm*—Sam Taipalatsky; Michelle Gallardo; Nicholas J. Pauley

(57) ABSTRACT

A method of fabricating a semiconductor using a fin field effect transistor (FINFET) is disclosed. In a particular embodiment, a method includes depositing, on a silicon substrate, a first dummy structure having a first sidewall and a second sidewall separated by a first width. The method also includes depositing, on the silicon substrate, a second dummy structure concurrently with depositing the first dummy structure. The second dummy structure has a third sidewall and a fourth sidewall that are separated by a second width. The second width is substantially greater than the first width. The first dummy structure is used to form a first pair of fins separated by approximately the first width. The second dummy structure is used to form a second pair of fins separated by approximately the second width.

15 Claims, 15 Drawing Sheets

U.S. PATENT DOCUMENTS

| | | | |
|---|---|---|---|
| 2007/0024917 | A1 | 10/2007 | Yang et al. |
| 2007/0029299 | A1 | 12/2007 | Abadeer et al. |
| 2008/0191282 | A1 | 8/2008 | Bauer |
| 2008/0308880 | A1 | 12/2008 | Inaba |

OTHER PUBLICATIONS

Endo, Kazuhiko et al, "Enhancing Noise Margins of FinFET SRAM by Integrating Vth-Controllable Flexible-Pass Gates," 2008 IEE 978-1-4244-2364-4/08, p. 146.

Arnim, K. von et at., "A Low-Powered Multi-Gate FET CMOS Technology with 13.9ps Inverter Delay, Large-Scale Integrated High Performance Digital Circuits and SRAM," 2007 Symposium on VLSI Technology Digest of Technical Papers,978-4-900784-03-1, p. 106.

Yagishita, Atsuhi, "FinFET SRAM Process Technology for hp32 nm Node and Beyond," 2007 IEEE 1-4244-0757-5/07, p. 1, ICICDT07.

Inaba,Stoshi et al., "Direct Evaluation of DC Characteristic Variability in FinFET SRAM Cell for 32nm Node and Beyond," 2007 IEEE 1-4244-0439-X/07, p. 487.

Bansal, Aditya et al., "Device-Optimization Technique for Robust and Low-Power FinFET SRAMDeisgn in NanoScale Era," 2007 IEEE 0018-9383, p. 1409, IEEE Transactions on Electron Devices, vol. 54, No. 6, Jun. 2007.

Marshall, Andrew et al, "A Merged MuGFET and Planar SOI Process," 2007 IEEE 978-1-4244-1593-9/07, p. 39.

Gangwal,Saakshi et al.,"Optimization of Surface Orientation for High-Performance, Low-Power and Robust FinFET SRAM," Electrical and Computer Engineering, ECE Technical Reports, Purdue Libraries 2006, http://docs.lib.purdue.edu/ecetr//330.

Knoblinger, G. et al, "Multi-Gate MOSFET Design," IEEE 2006 1-4244-0303-4/06, p. 66.

Kawasaki, H. et al., "Embedded Bulk FinFET SRAM Cell Technology with Planar FET Peripheral Circuit for hp32 nm Node and Beyond," IEEE 2006 1-4244-0555-8/06, 2006 Symposium on VLSI Technology Digest of Technical Papers.

Okano, K. et al, "Process Integration Technology and Device Characteristics of CMOS FinFET on Bulk Silicon Substrate with sub-10nmFin Width and 20 nm Gate Length," IEEE 2005 0-7803-9269-8/05, SoC Research & Development Center and Process & Manufacturing Engineering Center.

Kaneko, A. et al., "Sidewall Transfer Process and Selective Gate Sidewall Spacer Formation Technology for Sub-15nm FinFET with Elevated Source/Drain Extension," IEEE 2005 0-7803-9269-8/05, Process & Manufacturing Engineering Center, SoC Research & Development Center.

Witters, L. et al, "Integration of Tall Triple-Gate Devices with inserted-TaxNy Gate in a 0.274um2 6T-SRAM cell and Advanced CMOS Logic Circuits," 2005 Symposium on VLSI Technology Digest of Technical Papers, 4-900784-00-1, p. 106.

Kim, Sung Min et al, "Fully Working High Performance Multi-Channel Field Effect Transistor (McFET) SRAM Cell on Bulk Si Substrate Using TiN Single Metal Gate," 2005 Symposium on VLSI Technology Digest of Technical Papers, 4-900784-00-1, p. 196.

Mathew, I. et al, "Inverted T Channel (ITFET)—Fabrication and Characteristics of Vertical-Horizontal,Thin Body,Multi-Gate,Multi-Orientation Devices,ITFET SRAM Bit-cell Operation. A Novel Technology for 4nm and Beyond CMOS," IEEE 2005 0-7803-9269-8/05, APRDL Freescale Semiconductor Inc.

Ananthan, Hari et al, "FinFET SRAM—Device and Circuit Design Considerations," IEEE 2004, 0-7695-2093-6/04, Dept.of Electricaland Computer Engineering,Purdue University.

Chen, Hao-Yu et al, "Scaling of CMOS FinFETs Towards 10 nm," Taiwan Semiconductor Manufacturing Company, Ltd., IEEE 2003 0-7803-7765-6/03, p. 46.

Kuhn, Kelin J., "Reducing Variation in Advanced Logic Technologies: Approaches to Process and Design for Manufacturability of Nanoscale CMOS," Logic Technology Department, Intel Corporation.

Dixit, A. et al, "Impact of Stochastic Mismatch on Measured SRAM Performance of FinFETs with Resist/Spacer-Defined Fins: Role of Line-Edge-Roughness," IMEC,Belgium.

Thean, A.V-Y et al, "Performance and Variability Comparisons between Multi-Gate FETs and Planar SOI Transistors," Freescale Semiconductor Inc., Austin, TX.

International Search Report-PCT/US2009/063478, International Search Authority-European Patent Office Jan. 21, 2010.

Written Opinion-PCT/ US2009/063478, International Search Authority-European Patent Office Jan. 21, 2010.

Yang-Kyu Choi et al: "A Spacer Patterning Technologyfor Nanoscale CMOS" IEEE Transactions on Electron Devices, IEEE Service Center, Pisacataway, NJ, US, vol. 49, No. 3, Mar. 1, 2002, XP011017977, ISSN: 0018-9383.

METHOD OF FABRICATING A FIN FIELD EFFECT TRANSISTOR (FINFET) DEVICE

I. FIELD

The present disclosure is generally related to a method of fabricating a fin field effect transistor (FinFET) device.

II. DESCRIPTION OF RELATED ART

Static random access memory (SRAM) bitcells may be implemented using vertical double-gate or tri-gate fin field effect transistors (FinFETs). Using FinFETs enables SRAM bitcells to have one or more benefits over conventional planar Complimentary Metal Oxide Semiconductor (CMOS) technology, such as a smaller bitcell size, a larger cell current, a lower cell leakage current, or a higher static noise margin. FinFETs may be formed using a sidewall transfer method that yields an even number of fins. When the sidewall transfer method is used to fabricate a FinFET device having an odd number of fins, an even number of fins is created and then a fin is removed. However, removing one fin to yield an odd number of fins is a difficult process and requires a high degree of precision.

III. SUMMARY

In a particular embodiment, a method includes depositing, on a silicon substrate, a first dummy structure having a first sidewall and a second sidewall separated by a first width. The method also includes depositing, on the silicon substrate, a second dummy structure concurrently with depositing the first dummy structure. The second dummy structure has a third sidewall and a fourth sidewall that are separated by a second width. The second width is substantially greater than the first width. The first dummy structure is used to form a first pair of fins separated by approximately the first width. The second dummy structure is used to form a second pair of fins separated by approximately the second width.

In another particular embodiment, an electronic device is disclosed. The electronic device includes a first pair of fins that are first and second protrusions on an etched silicon substrate. The first protrusion is substantially parallel to the second protrusion. The first protrusion and the second protrusion are separated by a first width. The electronic device also includes a second pair of fins that are third and fourth protrusions separated by a second width on the etched silicon substrate. The second width is different than the first width. The electronic device also includes a third pair of fins that are fifth and sixth protrusions separated by a third width on the etched silicon substrate. The second pair of fins is located between the first pair of fins and the third pair of fins. The first and second pair of fins are formed by applying a lithographic mask with dummy structures having different sizes.

In another particular embodiment, a method of fabricating a static random access memory (SRAM) is disclosed. The method includes forming a first dummy structure using a lithographic mask. The first dummy structure has a first width and first laterally opposed sidewalls. The method further includes forming a second dummy structure concurrently with forming the first dummy structure. The second dummy structure has a second width that is substantially greater than the first width. The second dummy structure has second laterally opposed sidewalls. The method further includes forming a third dummy structure concurrently with the first dummy structure. The third dummy structure has the first width and has third laterally opposed sidewalls. The method further includes depositing a first insulating material on the first laterally opposed sidewalls to form a first insulating spacer and a second insulating spacer. The method further includes depositing a second insulating material on the second laterally opposed sidewalls to form a third insulating spacer and a fourth insulating spacer. The method further includes depositing a third insulating material on the third laterally opposed sidewalls to form a fourth insulating spacer and a fifth insulating spacer. The method further includes removing the first dummy structure, removing the second dummy structure, and removing the third dummy structure.

In another particular embodiment a method includes depositing, on a silicon substrate, a first dummy structure having a first sidewall and a second sidewall separated by a first width. The method also includes depositing, on the silicon substrate, a second dummy structure concurrently with depositing the first dummy structure. The second dummy structure has a third sidewall and a fourth sidewall separated by a second width. The second width is substantially greater than the first width. The method also includes depositing a first insulating material to form a first insulating spacer adjacent to the first sidewall and to form a second insulating spacer adjacent to the second sidewall. The method also includes depositing a second insulating material to form a third insulating spacer adjacent to the third sidewall and a fourth insulating spacer adjacent to the fourth sidewall. The method also includes removing the first dummy structure from the silicon substrate. The method also includes removing the second dummy structure from the silicon substrate.

A particular advantage provided by at least one of the disclosed embodiments is a simplified dummy structure patterning process due to larger feature sizes for certain field effect transistors (FETs) of a bitcell. Another particular advantage provided by at least one of the disclosed embodiments is that one fin does not have to be removed to form a pull-up FET because two fins are used for each pull-up device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
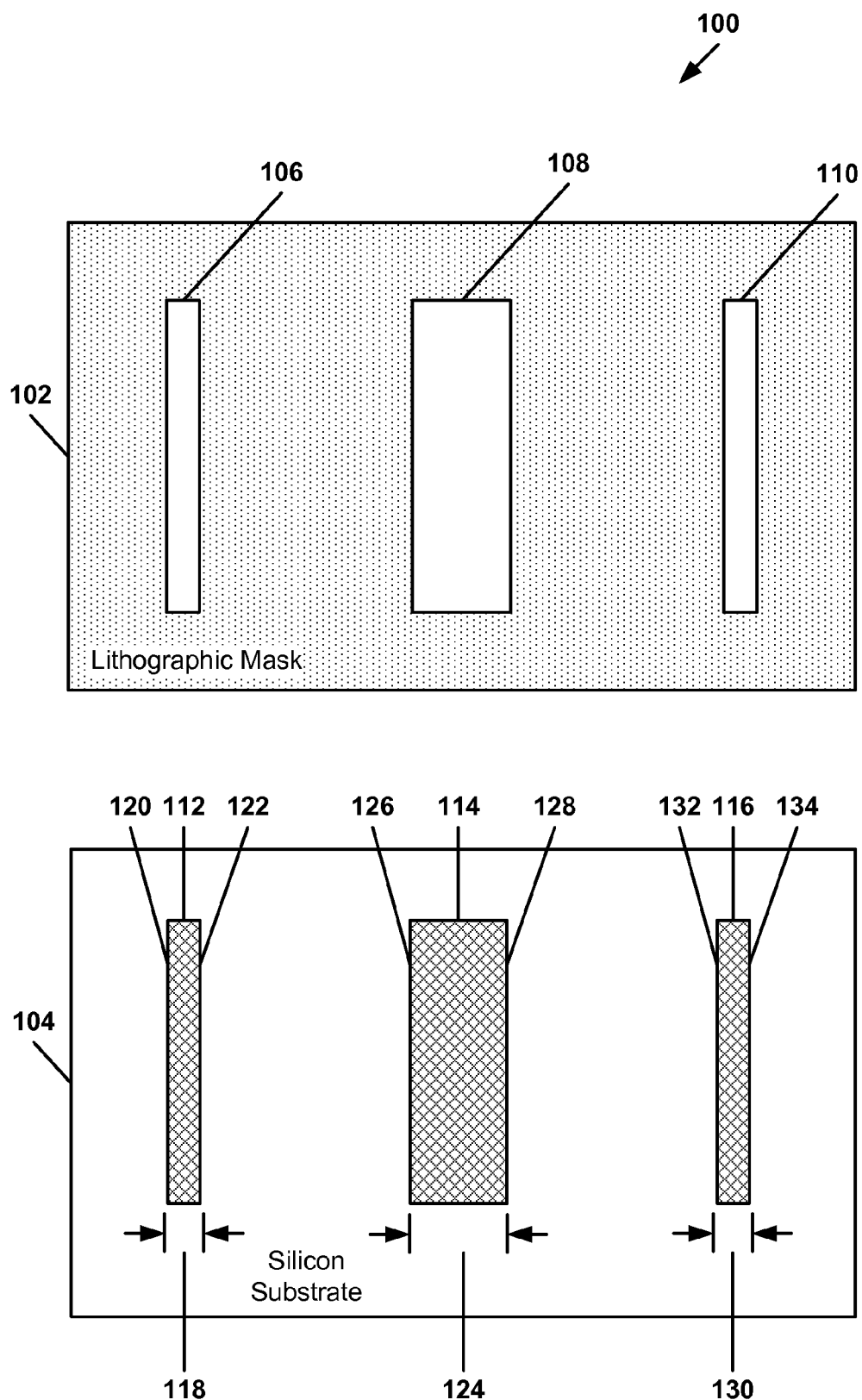
FIG. 1 is a block diagram of a first illustrative embodiment of fabricating a fin field effect transistor (FinFET) device.

Referring to FIG. 1, a first illustrative embodiment of a portion of a process to fabricate a fin field effect transistor (FinFET) device is disclosed and generally designated 100. FIG. 1 illustrates a lithographic mask 102 that includes a first window 106, a second window 108, and a third window 110. The lithographic mask 102 may be used to concurrently deposit a first dummy structure 112, a second dummy structure 114, and a third dummy structure 116 on a silicon substrate 104 via a lithography process.

The first dummy structure 112 has a first width 118, a first sidewall 120 and a second sidewall 122. In an illustrative embodiment, the first sidewall 120 and the second sidewall 122 are first laterally opposed sidewalls. The second dummy structure 114 has a second width 124. In an illustrative embodiment, the second width 124 may be different than the first width 118. For example, the second width 124 may be substantially greater than the first width 118.

Figure 9:
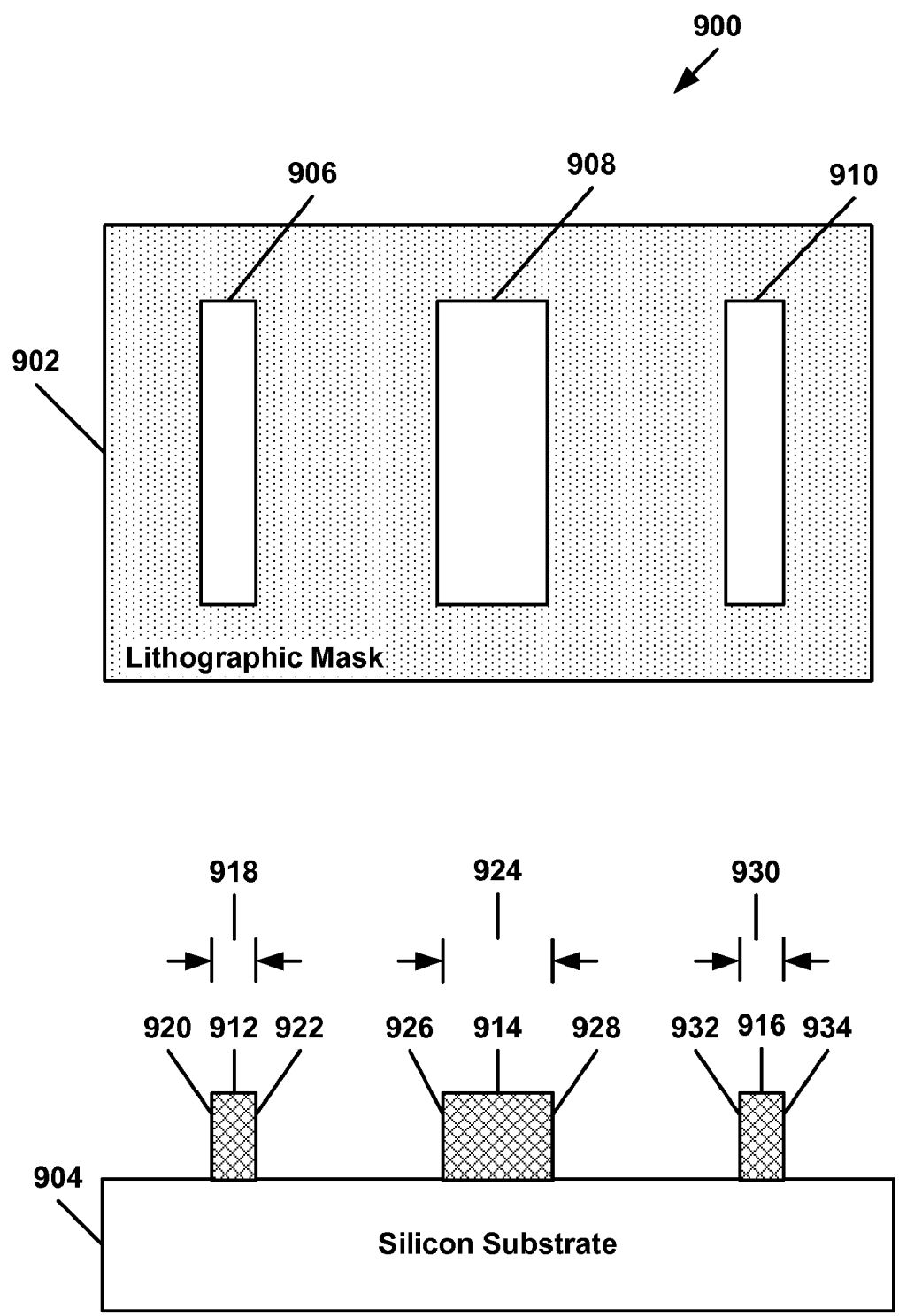
FIG. 9 is a block diagram of a ninth illustrative embodiment of fabricating a FinFET device.

The second dummy structure 114 has a third sidewall 126 and a fourth sidewall 128. In an illustrative embodiment, the third sidewall 126 and the fourth sidewall 128 are referred to as second laterally opposed sidewalls. The third dummy structure 116 has a third width 130. In an illustrative embodiment, the third width 130 may be approximately the same as the first width 118. The third dummy structure 116 has a fifth sidewall 132 and a sixth sidewall 134. In an illustrative embodiment, the fifth sidewall 132 and the sixth sidewall 134 are referred to as third laterally opposed sidewalls. An example of a side view of fabricating a fin field effect transistor (FinFET) device is illustrated in FIG. 9.

In a particular illustrative non-limiting embodiment, the second width 124 is greater than the first width 118 and the second width 124 is greater than the third width 130. In an illustrative non-limiting embodiment, the first width 118 and the third width 124 are between 10 and 30 nanometers (nm) wide and the second width 130 is between 40 and 70 nm wide.

The first sidewall 120 and the second sidewall 122 are used to form dual-fin transistors. Similarly, the fifth sidewall 132 and the sixth sidewall 134 are used to form dual-fin transistors. Making the second width 124 substantially greater than the first width 118 and the third width 130 enables the third sidewall 126 and the fourth sidewall 128 to be used in separate one-fin devices. When the second width 124 is substantially equal in size to the first width 118 and to the third width 130, either the third sidewall 126 or the fourth sidewall 128 is removed in order to create separate one-fin devices.

Thus, forming a second dummy structure with a width greater than the width of the first dummy structure and greater than the width of the third dummy structure, enables a simplified dummy structure patterning process. As will be discussed in more detail in FIG. 4, the greater width of the second dummy structure enables portions of material deposited on either side of the dummy structure to be easily removed, enabling the second dummy structure to be used to form separate one-fin devices. Further, this method does not require one fin to be removed as each fin is used for an FET, such as a pull-up FET. The methods described may be applied to fabricate any FinFET that has a similar layout, i.e. a layout with a double fin and a single fine. For example, the methods described may be applied to fabricate any FinFET that has multiples of the layout with a double fin and a single fin.

Figure 2:
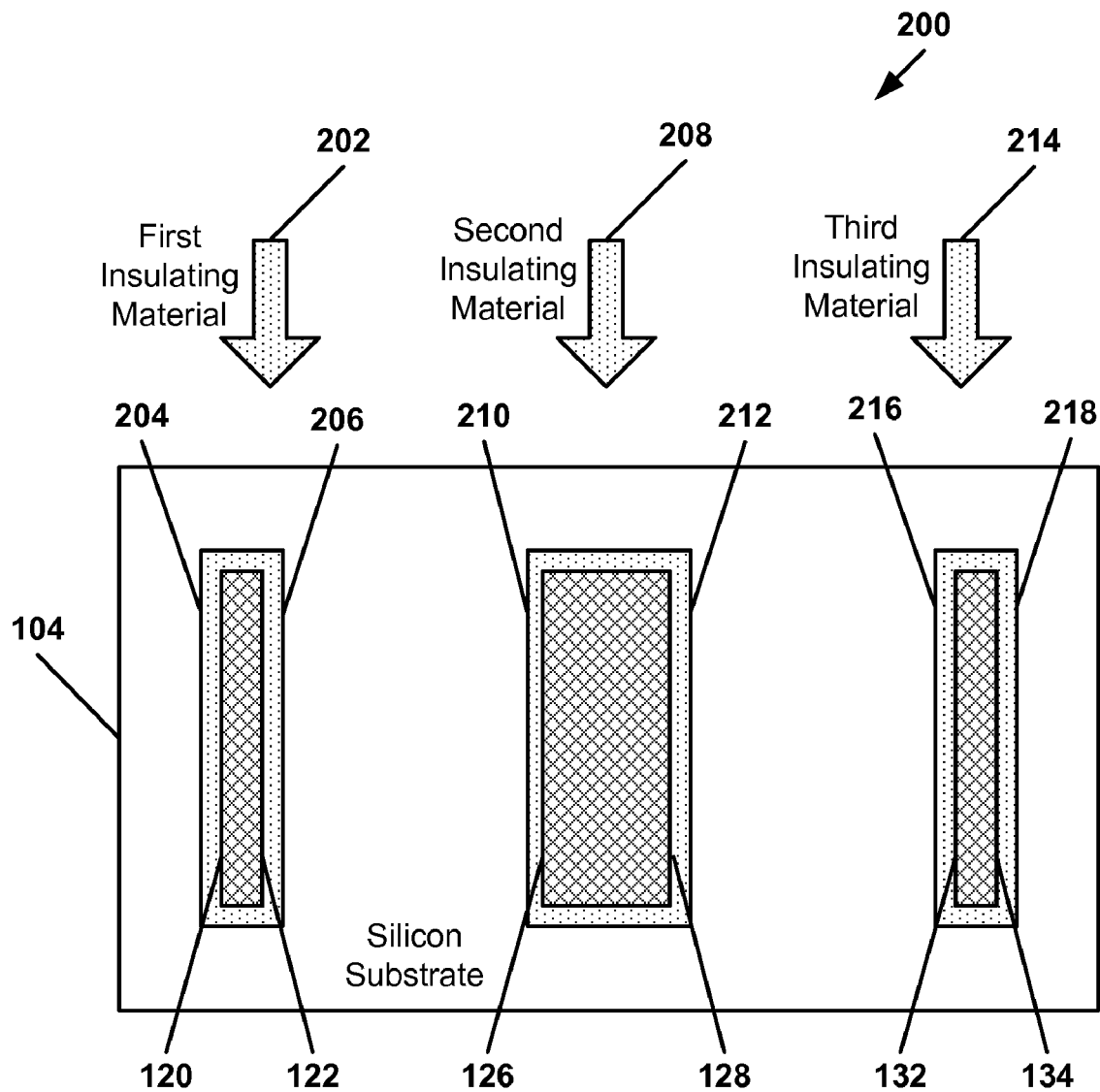
FIG. 2 is a block diagram of a second illustrative embodiment of fabricating a FinFET device.

Referring to FIG. 2, a second illustrative embodiment of a portion of a process to fabricate a fin field effect transistor (FinFET) device is disclosed and generally designated 200. The silicon substrate 104 includes the first dummy structure 112 having the first laterally opposed sidewalls 120 and 122, the second dummy structure 114 having the second laterally opposed sidewalls 126 and 128, and the third dummy structure 116 having the third laterally opposed sidewalls 132 and 134.

A first insulating material 202 may be deposited on the first laterally opposed sidewalls 120 and 122 to form a first insulating spacer 204 and a second insulating spacer 206. A second insulating material 208 may be deposited on the second laterally opposed sidewalls 126 and 128 to form a third insulating spacer 210 and a fourth insulating spacer 212. A third insulating material 214 may be deposited on the third laterally opposed sidewalls 132 and 134 to form a fifth insulating spacer 216 and a sixth insulating spacer 218.

Initially, the first insulating spacer 204 and the second insulating spacer 206 are joined. However, in subsequent steps, portions of the insulating material that joins the first insulating spacer 204 and the second insulating spacer 206 are removed, enabling a first fin to be formed using the first insulating spacer as an etch mask and enabling a second fin to be formed using the second insulating spacer as an etch mask. Further, in subsequent steps, portions of the insulating material that joins the third insulating spacer 210 and the fourth insulating spacer 212 are removed, enabling a third fin and a fourth fin to be formed. In addition, portions of the insulating material that joins the fifth insulating spacer 216 and the sixth insulating spacer 218 are removed, enabling a fifth fin and a sixth fin to be formed.

Figure 3:
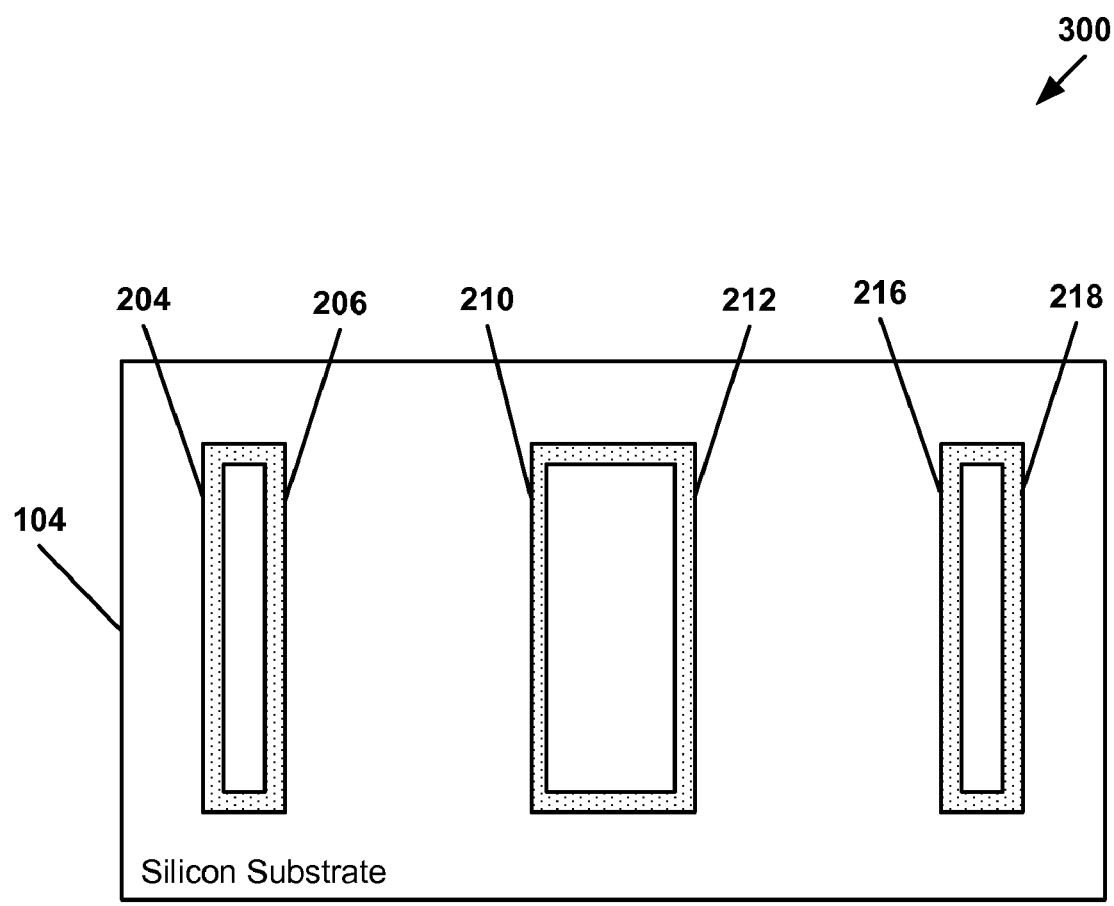
FIG. 3 is a block diagram of a third illustrative embodiment of fabricating a FinFET device.
Figure 3:
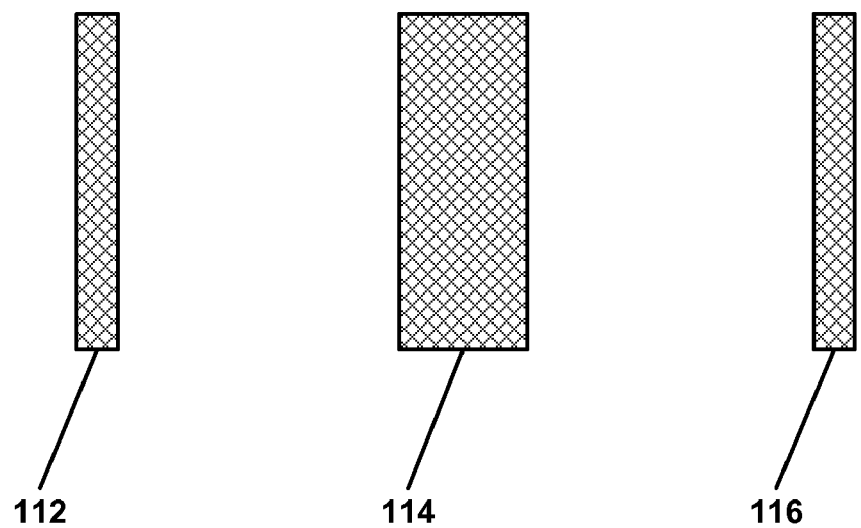

Referring to FIG. 3, a third illustrative embodiment of a portion of a process to fabricate a fin field effect transistor (FinFET) device is disclosed and generally designated 300. In FIG. 3, the first dummy structure 112, the second dummy structure 114, and the third dummy structure 116 are removed from the silicon substrate 104. Although FIG. 3 illustrates that the dummy structures 112, 114, and 116 are removed as whole structures, the dummy structures 112, 114, and 116 may be removed via an etch or otherwise dissolved.

Figure 4:
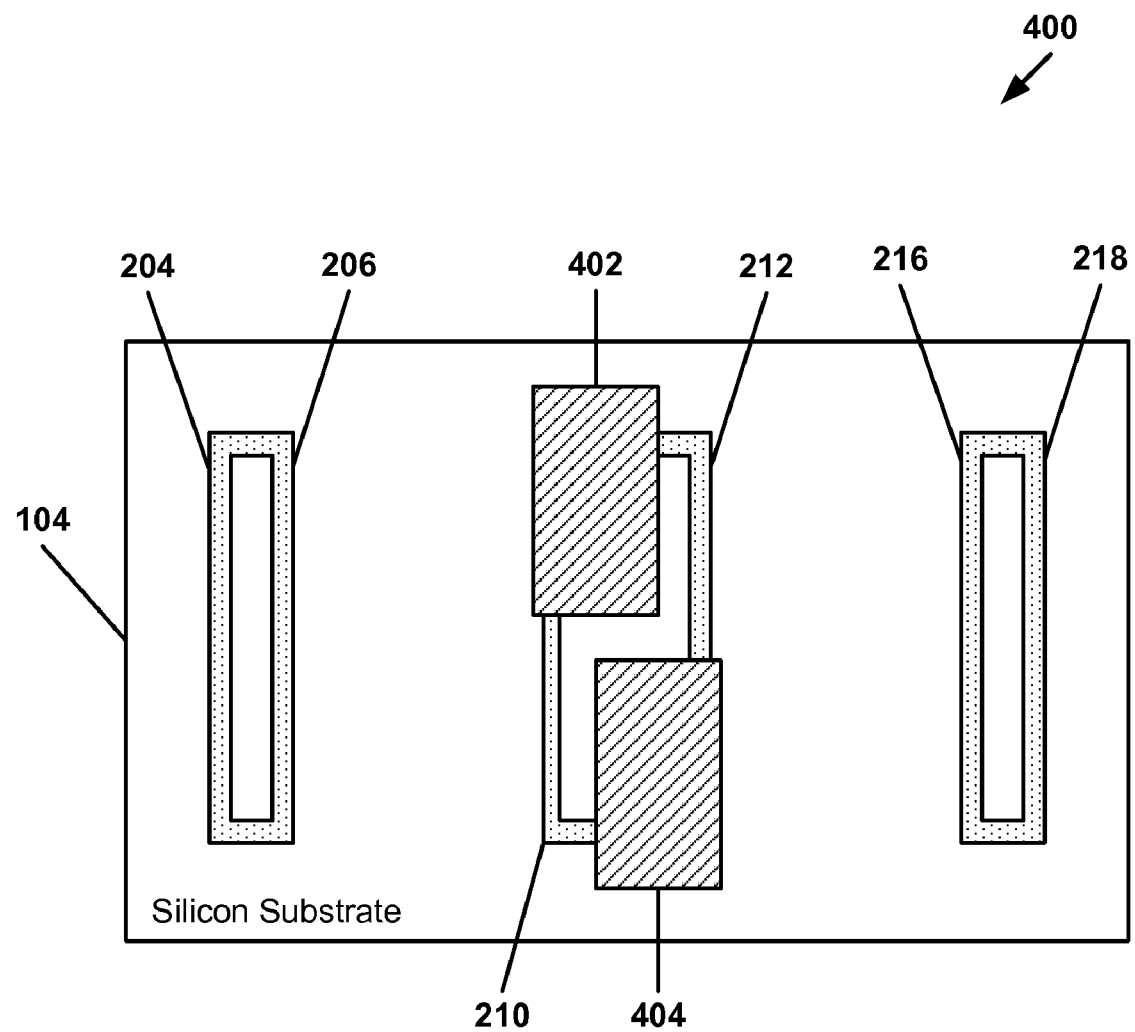
FIG. 4 is a block diagram of a fourth illustrative embodiment of fabricating a FinFET device.

Referring to FIG. 4, a fourth illustrative embodiment of a portion of a process to fabricate a fin field effect transistor (FinFET) device is disclosed and generally designated 400. In FIG. 4, the first insulating spacer 204, the second insulating spacer 206, the third insulating spacer 210, the fourth insulating spacer 212, the fifth insulating spacer 216, and the sixth insulating spacer 218 are depicted on the silicon substrate 104. A first negative photo resist 402 is performed on the third insulating spacer 210 and a second negative photo resist 404 is performed the fourth insulating spacer 212.

Performing the photo resists 402 and 404 on the insulating spacers 210 and 212 enables two single fin devices to be easily formed because the insulating spacers 210 and 212 are separated by a width substantially greater than the width of the insulating spacers 204 and 206. In contrast, when the insulating spacers 210 and 212 are separated by a width substantially equivalent to the width of the insulating spacers 204 and 206, then forming a one fin device involves trying to remove one of the insulating spacers 210 and 212. Removing one of the insulating spacers 210 and 212 is typically difficult when the insulating spacers 210 and 212 are separated by a width substantially equivalent to the width of the insulating spacers 204 and 206 because of the very small width between the insulating spacers 210 and 212.

Figure 5:
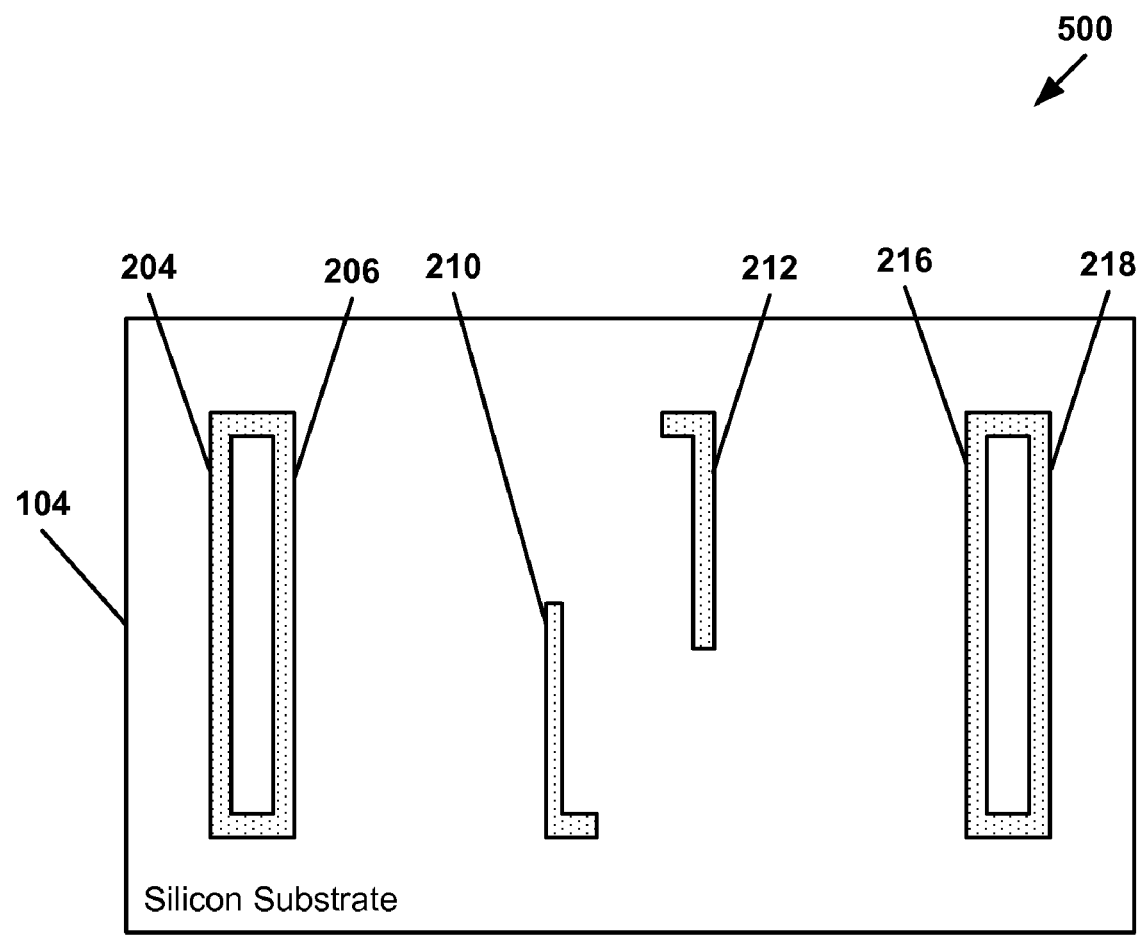
FIG. 5 is a block diagram of a fifth illustrative embodiment of fabricating a FinFET device.

Referring to FIG. 5, a fifth illustrative embodiment of a portion of a process to fabricate a fin field effect transistor (FinFET) device is disclosed and generally designated 500. FIG. 5 illustrates the FinFET device in FIG. 4 after performing the first negative photo resist 402 and after performing the second negative photo resist 404. FIG. 5 illustrates that the first negative photo resist 402 has removed a portion of the third insulating spacer 210 and that the second photo resist 404 has removed a portion of the fourth insulating spacer 212. Removing a portion of the third insulating spacer 210 enables the third insulating spacer 210 to be used for a single fin device. Additionally, removing a portion of the fourth insulating spacer 212 enables the fourth insulating spacer 212 to be used for a single fin device.

Figure 6:
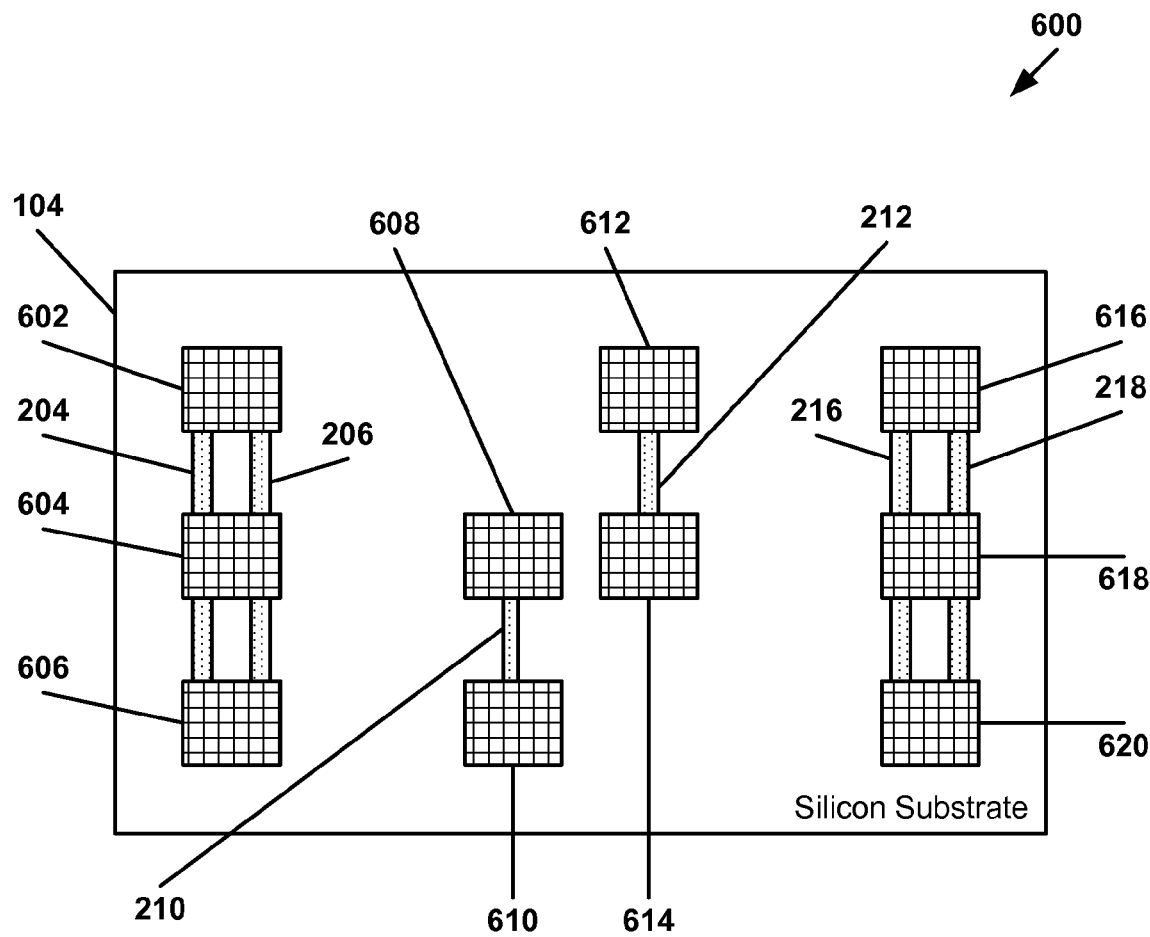
FIG. 6 is a block diagram of a sixth illustrative embodiment of fabricating a FinFET device.

Referring to FIG. 6, a sixth illustrative embodiment of a portion of a process to fabricate a fin field effect transistor (FinFET) device is disclosed and generally designated 600. In FIG. 6, a contact pad structure 602, a contact pad structure 604, and a contact pad structure 606 are deposited over their respective portions of the first insulating spacer 204. The contact pad structure 602, the contact pad structure 604, and the contact pad structure 606 are deposited over their respective portions of the second insulating spacer 206.

A contact pad structure 608 and a contact pad structure 610 may be deposited on the third insulating spacer 210. A contact pad structure 612 and a contact pad structure 614 may be deposited on the fourth insulating spacer 212. A contact pad structure 616, a contact pad structure 618, and a contact pad structure 620 may be deposited on the fifth insulating spacer 216 and may be deposited on the sixth insulating spacer 218.

Figure 7:
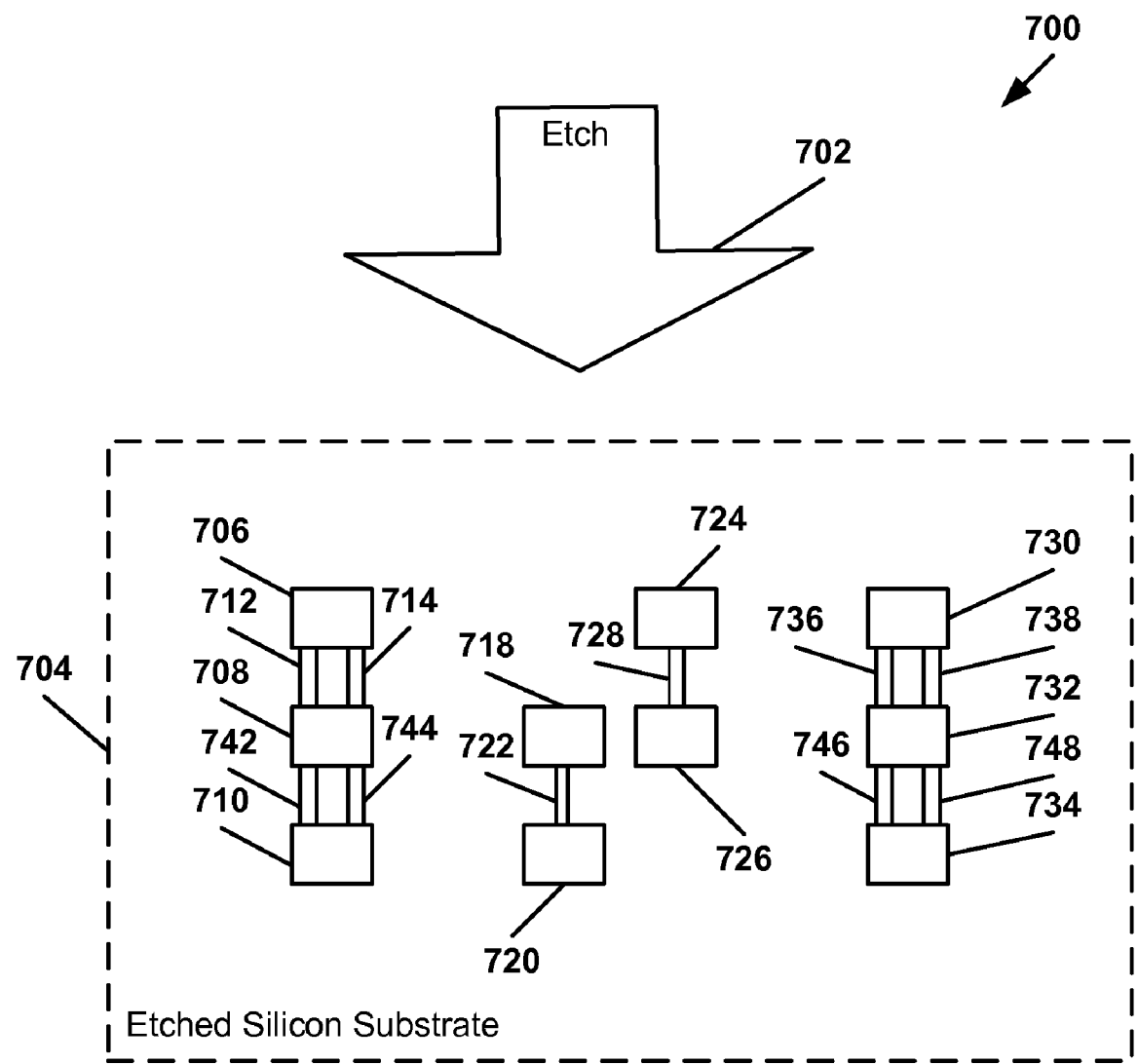
FIG. 7 is a block diagram of a seventh illustrative embodiment of fabricating a FinFET device.

Referring to FIG. 7, a seventh illustrative embodiment of a portion of a process to fabricate a fin field effect transistor (FinFET) device is disclosed and generally designated 700. An etch 702 is applied to the silicon substrate 104 in FIG. 6 to form the etched silicon substrate 704. In an illustrative embodiment, the etch 702 may be a silicon etch.

The insulating spacers 204, 206, 210, 212, 216, and 218 in FIG. 6 function as etch masks to so that the etch 702 forms a plurality of fins. The etch 702 may be used to form a first fin 712 under the first insulating spacer 204, a second fin 714 under the second insulating spacer 206, a third fin 722 under the third insulating spacer 210, a fourth fin 728 under the fourth insulating spacer 212, a fifth fin 736 under the fifth insulating spacer 216, and a sixth fin 738 under the sixth insulating spacer 218. The etch 702 may further be used to form seventh and eighth fins 742 and 744 under the first and second insulating spacers 204 and 206, and ninth and tenth fins 746 and 748 under the fifth and the sixth insulating spacers 216 and 218. Thus, the etch 702 may use the insulating spacers 204, 206, 210, 212, 216, and 218 as etch masks to form, on the etched silicon substrate 704, the fins 712, 714, 742, 744, 722, 728, 736, 738, 746, and 748. In an illustrative embodiment, at least one of the fins 712, 714, 742, 744, 722, 728, 736, 738, 746, and 748 may be less than fifteen nanometers wide.

Further, the contact pad structures 602, 604, and 606 in FIG. 6 function as etch masks so that the etch 702 forms contacts 706, 708, and 710, respectively. Furthermore, after the etch 702 is complete the contact pad structures 608 and 610 may be removed to expose contacts 718 and 720, respectively. In addition, after the etch 702 is complete the contact pad structures 612 and 614 may be removed to expose contacts 724 and 726, respectively. Additionally, after the etch 702 is complete the contact pad structures 616, 618, and 620 may be removed to expose contacts 730, 732, and 734.

Figure 8:
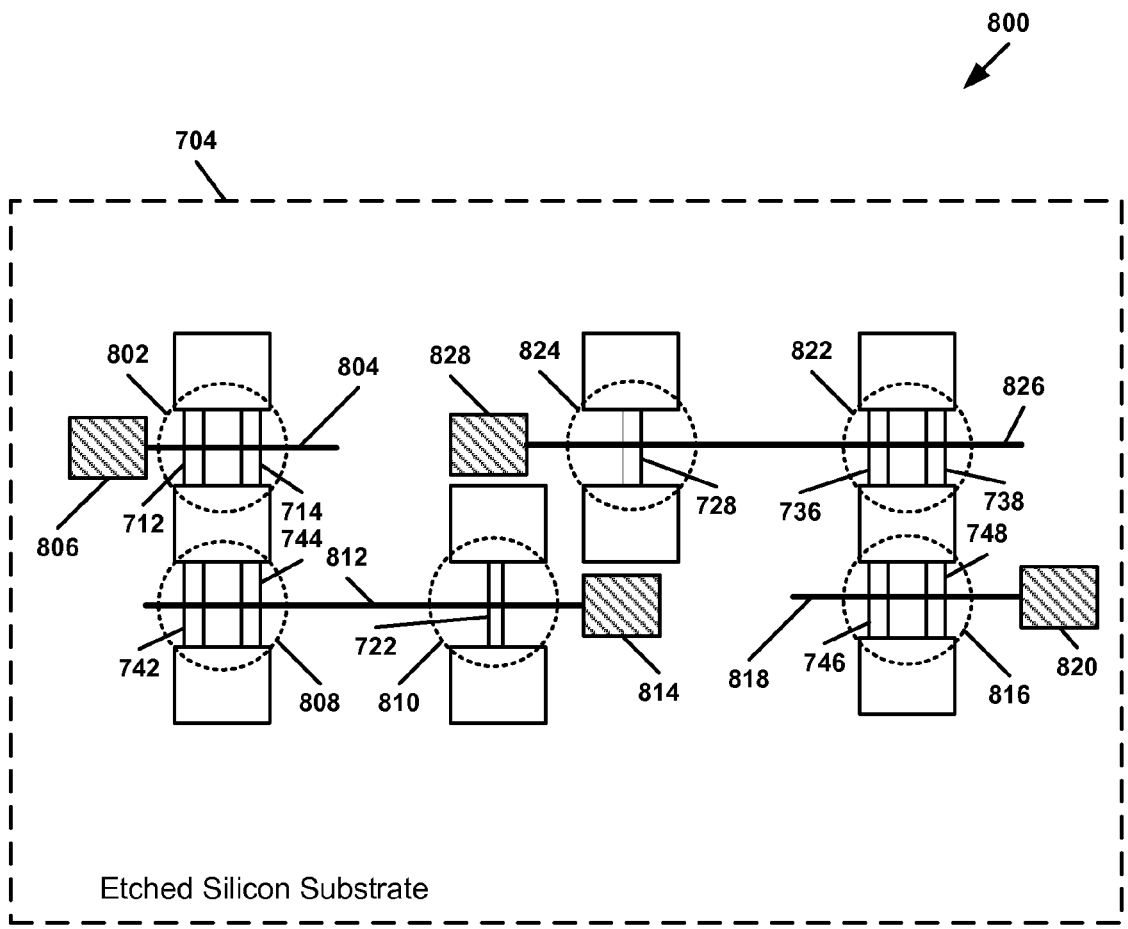
FIG. 8 is a block diagram of a eight illustrative embodiment of fabricating a FinFET device.

Referring to FIG. 8, an eighth illustrative embodiment of a portion of a process to fabricate a fin field effect transistor (FinFET) device is disclosed and generally designated 800. FIG. 8 illustrates how the FinFET fabrication process described herein may be used to fabricate a six-transistor (6T) static random access memory (SRAM) bitcell.

A first field effect transistor 802 may be formed by depositing on the etched silicon substrate 704 a first gate structure 804 across the fins 712 and 714 and by depositing a gate pad area 806 at one end of the first gate structure 804. The gate pad area 806 may enable a signal or voltage to be applied to the first gate structure 804 to enable the first gate structure 804 to modulate a current through the fins 712 and 714. In an illustrative embodiment, the first field effect transistor (FET) 802 may be a pass-gate field effect transistor.

A second field effect transistor 808 and a third field effect transistor 810 may be formed by depositing a second gate structure 812 across the fins 742, 744, and 722, and by depositing a gate pad area 814 at one end of the second gate structure 812. The gate pad area 814 may enable a voltage or signal to be applied to the second gate structure 812 to enable the second gate structure 812 to modulate a current through the fins 742, 744, and 722 via the second gate structure 812. In an illustrative embodiment, the second field effect transistor 808 is a pull-down field effect transistor and the third field effect transistor 810 is a pull-up field effect transistor.

A fourth field effect transistor 816 may be formed by depositing a third gate structure 818 across the fins 746 and 748 and by depositing a gate pad area 820 at one end of the third gate structure 818. The gate pad area 820 may enable a signal or voltage to be applied to the first gate structure 818 to enable a current to be modulated through the fins 746 and 748. In an illustrative embodiment, the fourth field effect transistor 816 is a pass-gate field effect transistor.

A fifth field effect transistor 822 and a sixth field effect transistor 824 may be formed by depositing a fourth gate structure 826 across the fins 728, 736, and 738, and by depositing a gate pad area 828 at one end of the fourth gate structure 826. The gate pad area 828 may enable a signal or voltage to be applied the fourth gate structure 826 to enable the fourth gate structure 826 to modulate a current through the fins 728, 736, and 738. In an illustrative embodiment, the second field effect transistor 808 is a pull-down field effect transistor and the third field effect transistor 810 is a pull-up field effect transistor. In an illustrative embodiment, the fifth field effect transistor is a pull-down field effect transistor and the sixth field effect transistor 824 is a pull-up field effect transistor. The transistors 802, 808, 810, 816, 822, and 824 may be interconnected to operate as a 6T SRAM bitcell.

Thus, by depositing a dummy structure 114 in FIG. 1 having the second width 124 that is substantially greater than the first width 118, the resulting fins 722 and 728 are separated by approximately the second width 124. The second width 124 enables the transistors 810 and 824 to each use a single fin each while the transistors 802, 808, 816 and 822 each use two fins, because the second width 124 is substantially greater than the first width 118 and the third width 130.

FIGS. 9-12 depict a sidewall transfer method using dummy structures having variable widths. Referring to FIG. 9, a ninth illustrative embodiment of a portion of a process to fabricate a fin field effect transistor (FinFET) device is disclosed and generally designated 900. FIG. 9 illustrates fabricating a FinFET using a side view perspective. In an illustrative embodiment, FIG. 9 depicts a side view of the portion of the fabrication process 100 of FIG. 1.

A lithographic mask 902 includes a first window 906, a second window 908, and a third window 910. The lithographic mask 902 may be used to concurrently form a first dummy structure 912, a second dummy structure 914, and third dummy structure 916 on a silicon substrate 904, using a single lithographic process.

The first dummy structure 912 has first laterally opposed sidewalls 920 and 922 separated by a first width 918. The second dummy structure 914 has second laterally opposed sidewalls 926 and 928 separated by a second width 924. In one illustrative embodiment, the second width 924 may be different than the first width 918. For example, the second width 924 may be substantially greater than the first width 918. The third dummy structure 916 has third laterally opposed sidewalls 932 and 934 separated by a third width 930.

Figure 10:
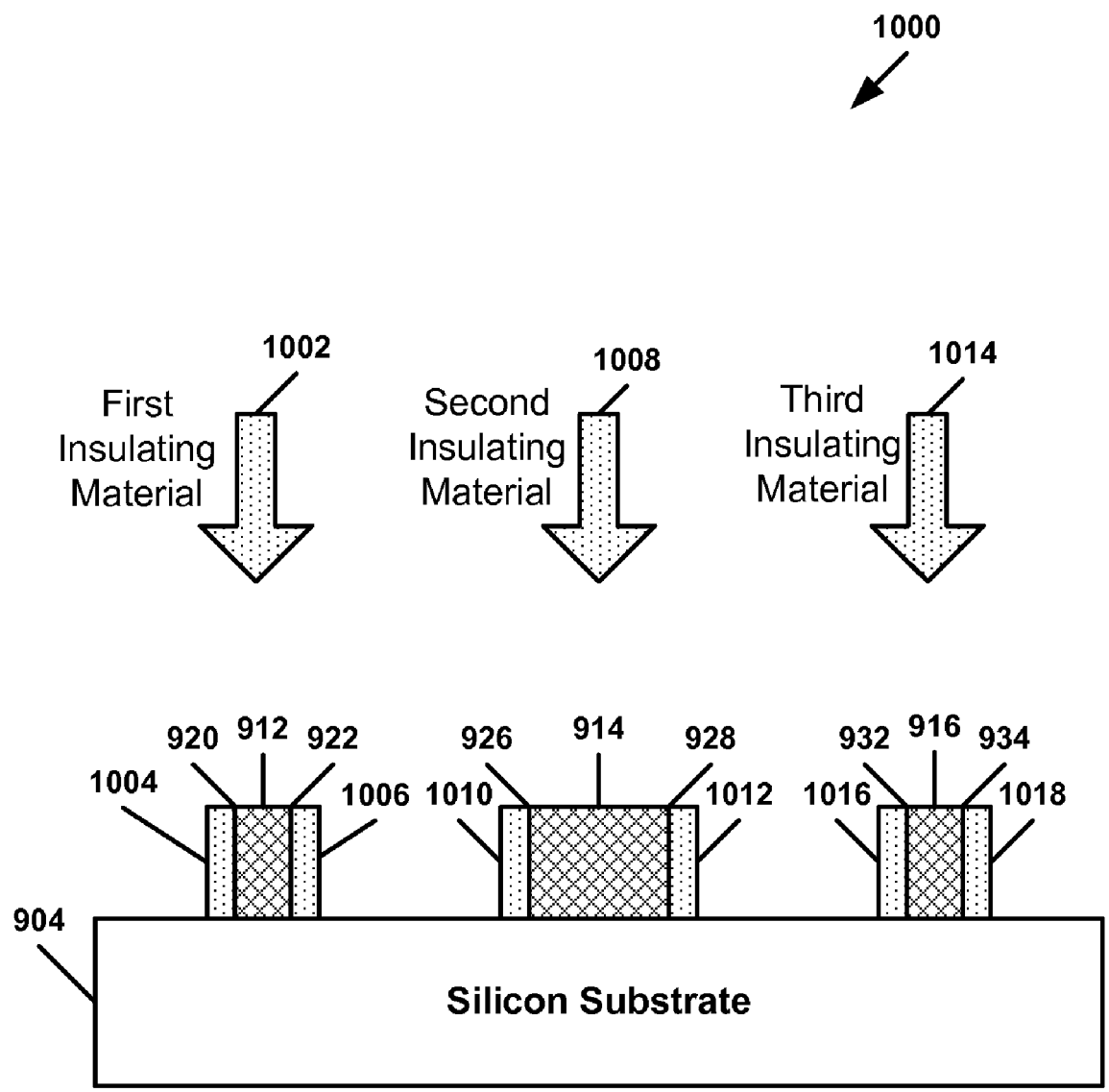
FIG. 10 is a block diagram of a tenth illustrative embodiment of fabricating a FinFET device.

Referring to FIG. 10, a tenth illustrative embodiment of a portion of a process to fabricate a fin field effect transistor (FinFET) device is disclosed and generally designated 1000. In an illustrative embodiment, FIG. 10 depicts a side view of the portion of the fabrication process 200 of FIG. 2. The silicon substrate 904 includes the first dummy structure 912 having the first laterally opposed sidewalls 920 and 922, the second dummy structure 914 having the second laterally opposed sidewalls 926 and 928, and the third dummy structure 916 having the third laterally opposed sidewalls 932 and 934. Insulating materials 1002, 1008, and 1014 are deposited on the laterally opposed sidewalls 920, 922, 926, 928, 932 and 934 to form insulating spacers 1004, 1006, 1010, 1012, 1016, and 1018, respectively.

Figure 11:
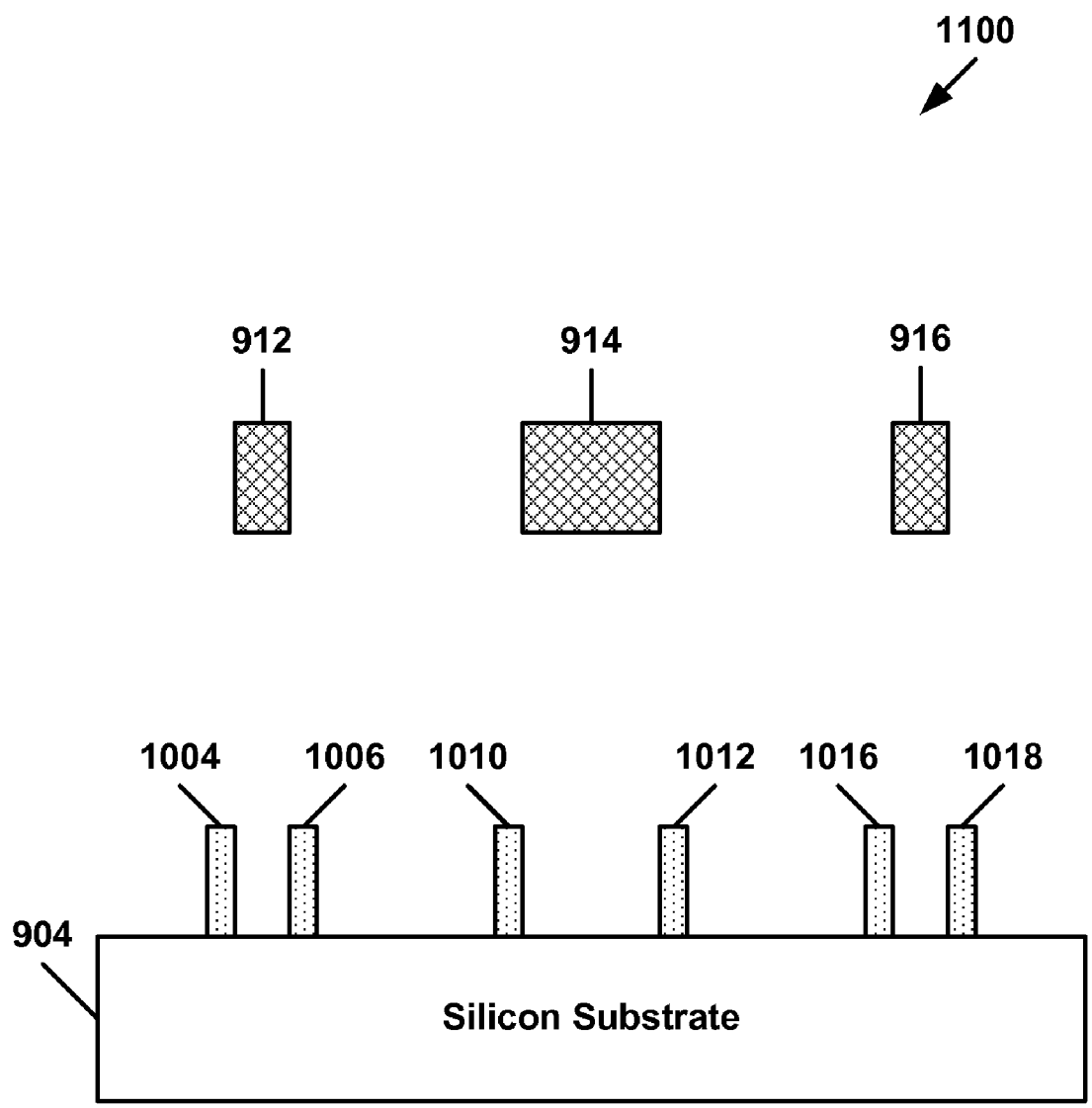
FIG. 11 is a block diagram of a eleventh illustrative embodiment of fabricating a FinFET device.

Referring to FIG. 11, an eleventh illustrative embodiment of a portion of a process to fabricate a fin field effect transistor (FinFET) device is disclosed and generally designated 1100. In an illustrative embodiment, FIG. 11 depicts a side view of the portion of the fabrication process 300 of FIG. 3. In FIG. 11, the first dummy structure 912, the second dummy structure 914, and the third dummy structure 916 are removed from the silicon substrate 904. Although FIG. 11 illustrates that the dummy structures 912, 914, and 916 are removed as whole structures, the dummy structures 912, 914, and 916 may be removed via an etch or otherwise dissolved. After removing the dummy structures 912, 914, and 916, the insulating spacers 1004, 1006, 1010, 1012, 1016, and 1018 remain on the silicon substrate 904.

Figure 12:
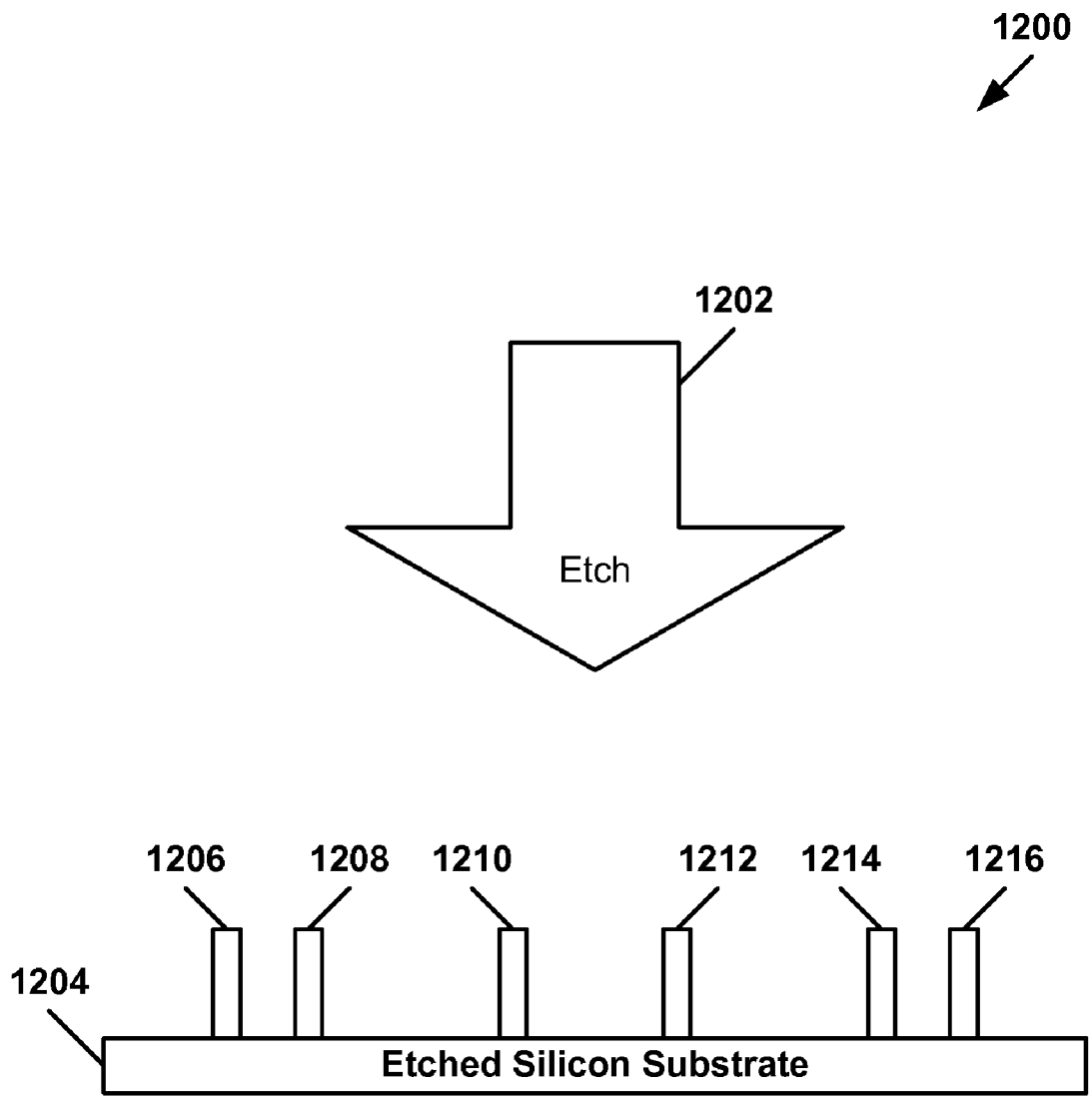
FIG. 12 is a block diagram of a twelfth illustrative embodiment of fabricating a FinFET device.

Referring to FIG. 12, a twelfth illustrative embodiment of a portion of a process to fabricate a fin field effect transistor (FinFET) device is disclosed and generally designated 1200. In an illustrative embodiment, FIG. 12 depicts a side view of the fabrication process 700 of FIG. 7 with contacts removed for illustration purposes. The FinFET device in FIG. 12 illustrates the result after applying an etch 1202 and removing the insulating spacers 1004, 1006, 1010, 1012, 1016, and 1018 from the silicon substrate 904 of FIG. 11. In an illustrative embodiment, the etch 1202 may be a silicon etch. The etch 1202 is used to form a first fin 1206 under the first insulating spacer 1004, a second fin 1208 under the second insulating spacer 1006, a third fin 1210 under the third insulating spacer 1010, a fourth fin 1212 under the fourth insulating spacer 1012, a fifth fin 1214 under the fifth insulating spacer 1016, and a sixth fin 1216 under the sixth insulating spacer 1018. Thus, the etch 1202 uses the insulating spacers 1004, 1006, 1010, 1012, 1016, and 1018 of FIG. 11 as etch masks to form the fins 1206, 1208, 1210, 1212, 1214, and 1216. In an illustrative embodiment, at least one of the fins 1206, 1208, 1210, 1212, 1214, and 1216 may be less than fifteen nanometers wide.

Each fin is a protrusion on the etched silicon substrate 1204. The fins are formed in pairs, such as, the first pair of fins 1206 and 1208, the second pair of fins 1210 and 1212, and the third pair of fins 1214 and 1216. The fins in each pair of fins is substantially parallel to each other and separated by widths corresponding to the widths of the dummy structures 912, 914, and 916 of FIG. 9. The first pair of fins 1206 and 1208 are separated by approximately the first width 118 of FIG. 1, the second pair of fins 1210 and 1212 are separated by approximately the second width 124, and the third pair of fins 1214 and 1216 are separated by approximately the third width 130. The second pair of fins 1210 and 1212 is located between the first pair of fins 1206 and 1208, and the third pair of fins 1214 and 1216 and may be used in separate single-fin transistors, such as the transistors 810 and 824 in FIG. 8.

Figure 13:
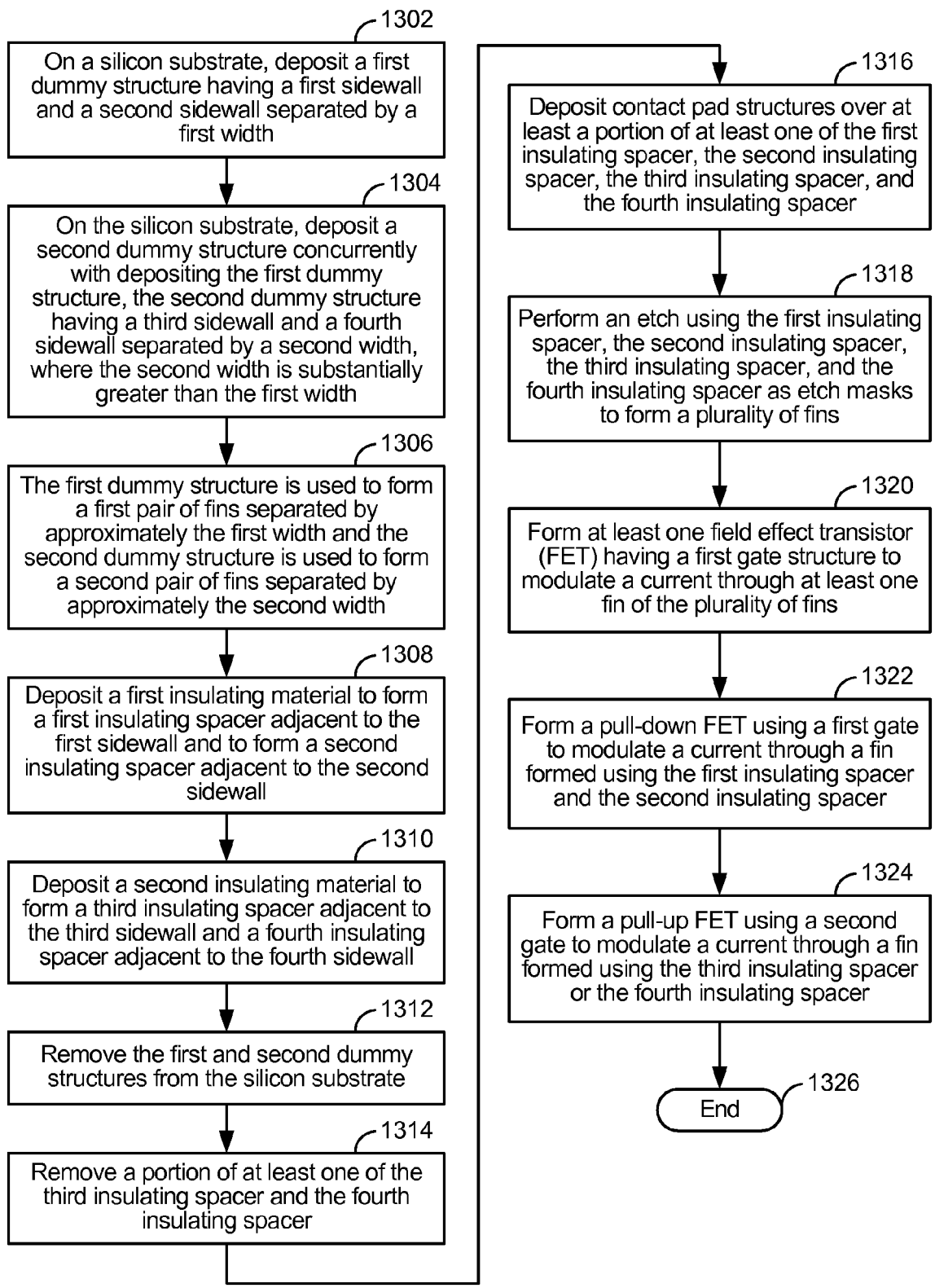
FIG. 13 is a flow diagram of a first illustrative embodiment of a method of fabricating a FinFET device.

FIG. 13 is a flow diagram of a first illustrative embodiment of a method of fabricating a fin field effect transistor (FinFET) device. At 1302, a first dummy structure is deposited on a silicon substrate. The first dummy structure has a first sidewall and a second sidewall separated by a first width. Continuing to 1304 a second dummy structure is deposited on the silicon substrate concurrently with depositing the first dummy structure. The second dummy structure has a third sidewall and a fourth sidewall separated by a second width. The second width is substantially greater than the first width. Moving to 1306, the first dummy structure is used to form a first pair of fins separated by approximately the first width and the second dummy structure is used to form a second pair of fins separated by approximately the second width. In a particular embodiment, the first and second dummy structures are the dummy structures 106 and 108 in FIG. 1.

Advancing to 1308, a first insulating material is deposited to form a first insulating spacer adjacent to the first sidewall and to form a second insulating spacer adjacent to the second sidewall. Proceeding to 1310, a second insulating material is deposited to form a third insulating spacer adjacent to the third sidewall and a fourth insulating spacer adjacent to the fourth sidewall. In a particular embodiment, the first, second, third and fourth insulating spacers are the insulating spacers 204, 206, 210, and 212 in FIG. 2.

Continuing to 1312, the first and second dummy structures are removed from the silicon substrate. In a particular embodiment, the first and second dummy structures are removed by dissolving the dummy structures using an etching process or other process for dissolving the dummy structures. Advancing to 1314, a portion of at least one of the third insulating spacer and the fourth insulating spacer is removed. In a particular embodiment, a negative photo resist process is performed to remove a portion of at least one of the third and fourth insulating spacers as illustrated in FIG. 5.

Proceeding to 1316, contact pad structures are deposited over at least a portion of at least one of the first insulating spacer, the second insulating spacer, the third insulating spacer, and the fourth insulating spacer. In a particular embodiment, the contact pad structures may be deposited over at least a portion of at least one of the insulating spacers as illustrated in FIG. 6.

Moving to 1318, an etch is performed using the first insulating spacer, the second insulating spacer, the third insulating spacer, and the fourth insulating spacer as etch masks to form a plurality of fins. In a particular embodiment, the etch that is performed is a silicon etch process. An example of the result of the etch is illustrated in FIG. 7. In a particular embodiment, the plurality of fins are implemented in a six-transistor (6T) static random access memory (SRAM) bitcell.

Continuing to 1320, at least one field effect transistor (FET) is formed to enable a first gate structure to modulate a current through at least one fin of the plurality of fins. In a particular embodiment, at least one field effect transistor is one of a pull-up FET, a pull-down FET and a pass-gate FET as illustrated in FIG. 8. In a particular embodiment, at least one fin is less than fifteen nanometers wide.

Advancing to 1322, a pull-down FET is formed using a first gate to modulate a current through a fin formed using the first insulating spacer and the second insulating spacer. Moving to 1324, a pull-up FET is formed using a second gate to modulate a current through a fin formed using the third insulating spacer or the fourth insulating spacer. The method ends at 1326.

Figure 14:
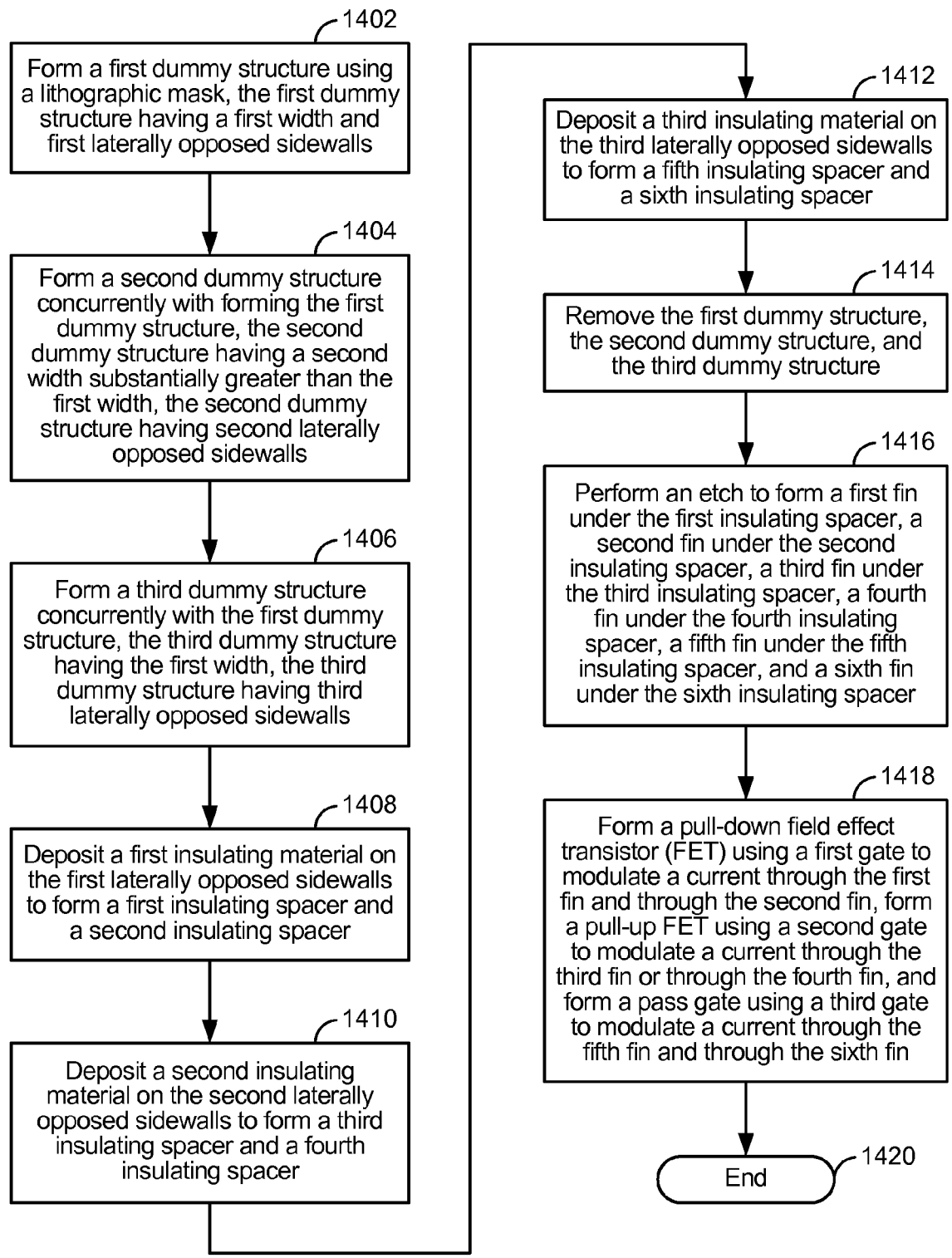
FIG. 14 is a flow diagram of a second illustrative embodiment of a method of fabricating a static random access memory (SRAM) device.

FIG. 14 is a flow diagram of a second illustrative embodiment of a method of fabricating a fin field effect transistor (FinFET) device. At 1402 a first dummy structure is formed using a lithographic mask. The first dummy structure has a first width and first laterally opposed sidewalls. Continuing to 1404, a second dummy structure is formed concurrently with the first dummy structure. The second dummy structure has second laterally opposed sidewalls. The second dummy structure may have a second width greater than the first width. In an illustrative embodiment, the second dummy structure has a second width significantly greater than the first width. Moving to 1406, a third dummy structure is formed. The third dummy structure has third laterally opposed sidewalls. The third dummy structure has the first width. In a particular embodiment, the first, second, and third dummy structures may be the dummy structures 112, 114, and 116 in FIG. 1.

Advancing to 1408, a first insulating material is deposited on the first laterally opposed sidewalls to form a first insulating spacer and a second insulating spacer. Moving to 1410, a second insulating material is deposited on the second laterally opposed sidewalls to form a third insulating spacer and a fourth insulating spacer. Proceeding to 1412, a third insulating material is deposited on the third laterally opposed sidewalls to form a fifth insulating spacer and a sixth insulating spacer. In a particular embodiment, the first, second, and third laterally opposed sidewalls may be the sidewalls 204, 206, 210, 212, 216, and 218 in FIG. 2. Continuing to 1414, the first dummy structure, the second dummy structure, and the third dummy structure are removed.

Advancing to 1416, an etch is performed to form a first fin under the first insulating spacer, a second fin under the second insulating spacer, a third fin under the third insulating spacer, a fourth fin under the fourth insulating spacer, a fifth fin under the fifth insulating spacer, and a sixth fin under the sixth insulating spacer. In a particular embodiment, the fins 712, 714, 722, 728, 736, 738, 742, 744, 746, and 748 are formed via the etch 702 as illustrated in FIG. 7.

Moving to 1418, a pull-down field effect transistor (FET) is formed using a first gate to modulate a current through the first fin and through the second fin, a pull-up FET is formed using a second gate to modulate a current through the third fin or through the fourth fin, and a pass-gate FET is formed using a third gate to modulate a current through the fifth fin and through the sixth fin. In a particular embodiment, the pull-down FET is the FET 808 in FIG. 8, the pull-up FET is FET 810, and the push gate is FET 802. The method ends at 1420.

Figure 15:
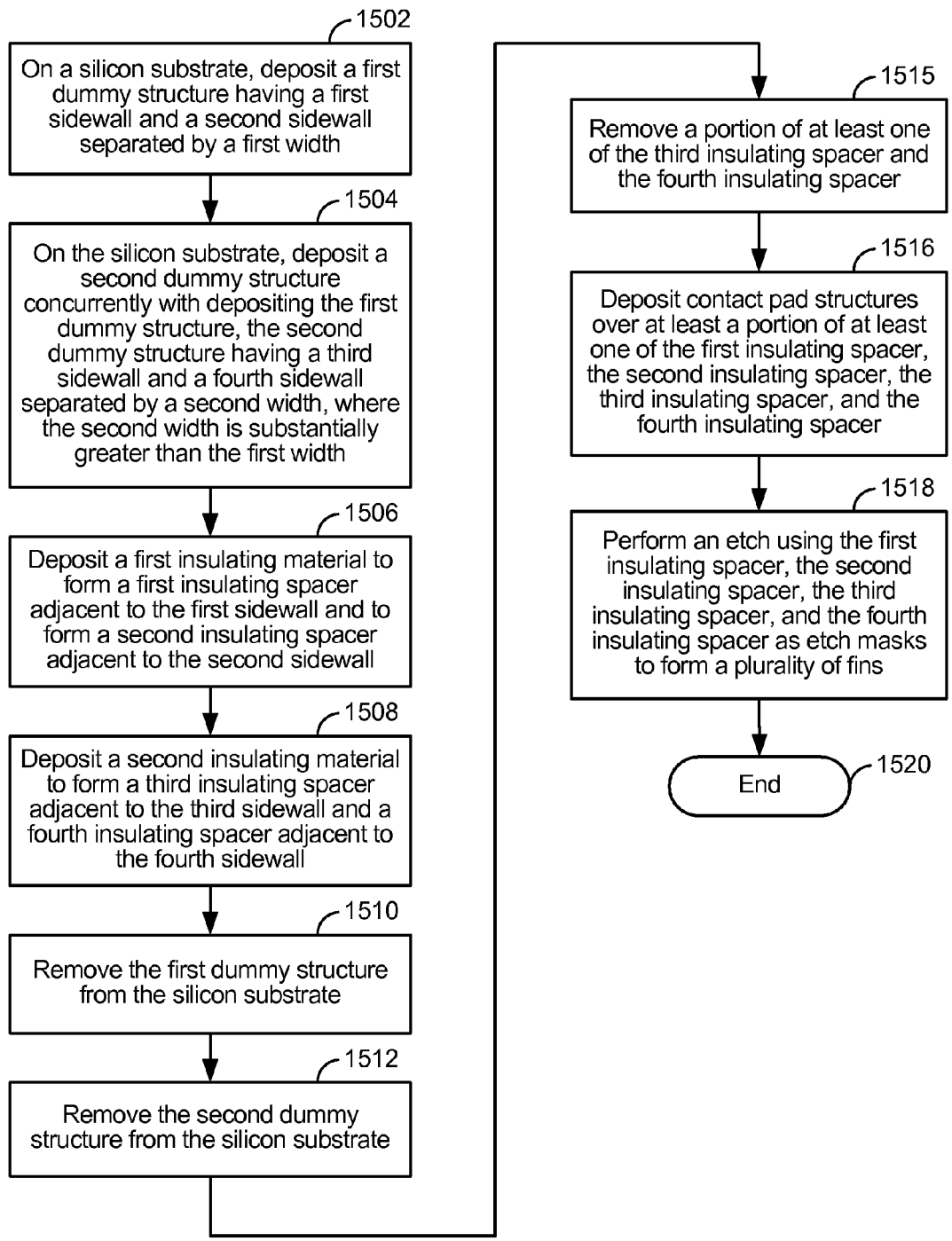
FIG. 15 is a flow diagram of a third illustrative embodiment of a method of fabricating a static random access memory (SRAM) device

FIG. 15 is a flow diagram of a third illustrative embodiment of a method of fabricating a fin field effect transistor (FinFET) device. At 1502, a first dummy structure is deposited on a silicon substrate. The first dummy structure has a first sidewall and a second sidewall separated by a first width. Continuing to 1504, a second dummy structure is deposited on the silicon substrate concurrently with depositing the first dummy structure. The second dummy structure has a third sidewall and a fourth sidewall separated by a second width, wherein the second width is substantially greater than the first width. In a particular embodiment, the first width is between 10 and 30 nanometers and the second width is between 40 and 70 nanometers. In a particular embodiment, the first dummy structure is the dummy structure 112 or 116 in FIG. 1 and the second dummy structure is the dummy structure 114.

Proceeding to 1506, a first insulating material is deposited to form a first insulating spacer adjacent to the first sidewall and to form a second insulating spacer adjacent to the second sidewall. Moving to 1508, a second insulating material is deposited to form a third insulating spacer adjacent to the third sidewall and a fourth insulating spacer adjacent to the fourth sidewall.

Advancing to 1510, the first dummy structure is removed from the silicon substrate. Continuing to 1512, the second dummy structure is removed from the silicon substrate. In a particular embodiment, the first and second dummy structures 112 and 114 in FIG. 1 may be removed from the silicon substrate 104.

Proceeding to 1514, a portion of at least one of the third insulating spacer and the fourth insulating spacer is removed. In a particular embodiment, a portion of the insulating spacers 210 and 212 is removed as in FIG. 500. In an illustrative embodiment, a photo resist process, such as a negative photo resist process, is used to remove the insulating spacers. Advancing to 1516, contact pad structures are deposited over at least a portion of at least one of the first insulating spacer, the second insulating spacer, the third insulating spacer, and the fourth insulating spacer. In a particular embodiment, the contact pad structures 602, 604, 606, 608, 610, 612, 614, 616, 618, and 620 are deposited on insulating spacers 204, 206, 210, 212, 216, and 218, as in FIG. 6.

Moving to 1518, an etch is performed using the first insulating spacer, the second insulating spacer, the third insulating spacer, and the fourth insulating spacer as etch masks to form a plurality of fins. In a particular embodiment, the etch 702 is a silicon etch, and the etch 702 is used to create the fins 712, 714, 722, 728, 736, 738, 742, 744, 746, and 748 as in FIG. 7. The method ends at 1520.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    depositing, on a silicon substrate, a first dummy structure having a first sidewall and a second sidewall separated by a first width;
    depositing, on the silicon substrate, a second dummy structure concurrently with depositing the first dummy structure, the second dummy structure having a third sidewall and a fourth sidewall separated by a second width, wherein the second width is substantially greater than the first width;
    depositing a first insulating material to form a first insulating spacer adjacent to the first sidewall and to form a second insulating spacer adjacent to the second sidewall;
    depositing a second insulating material to form a third insulating spacer adjacent to the third sidewall and a fourth insulating spacer adjacent to the fourth sidewall; and
    removing a portion of at least one of the third insulating spacer and the fourth insulating spacer;
    wherein the first dummy structure is used to form a first pair of fins separated by approximately the first width;
    wherein the second dummy structure is used to form a second pair of fins separated by approximately the second width.

2. The method of claim 1, further comprising:
    removing the first dummy structure from the silicon substrate; and
    removing the second dummy structure from the silicon substrate.

3. The method of claim 1, further comprising depositing contact pad structures over at least a portion of at least one of the first insulating spacer, the second insulating spacer, the third insulating spacer, and the fourth insulating spacer.

4. The method of claim 3, further comprising performing a silicon etch using the first insulating spacer, the second insulating spacer, the third insulating spacer, and the fourth insulating spacer as etch masks to form a plurality of fins.

5. The method of claim 4, wherein the plurality of fins are implemented in a six-transistor (6T) static random access memory (SRAM) bitcell.

6. The method of claim 5, further comprising forming at least one field effect transistor (FET) having a first gate structure to modulate a current through at least one fin of the plurality of fins.

7. The method of claim 6, wherein the at least one field effect transistor is one of a pull-up FET, a pull-down FET and a pass-gate FET.

8. The method of claim 4, wherein at least one fin of the plurality of fins is less than fifteen nanometers wide.

9. The method of claim 4, further comprising:
    forming a pull-down FET using a first gate to modulate a current through a fin formed using the first insulating spacer and the second insulating spacer; and
    forming a pull-up FET using a second gate to modulate a current through a fin formed using the third insulating spacer or the fourth insulating spacer.

10. A method of fabricating a static random access memory (SRAM), the method comprising:
    forming a first dummy structure using a lithographic mask, the first dummy structure having a first width and first laterally opposed sidewalls;
    forming a second dummy structure concurrently with forming the first dummy structure, the second dummy structure having a second width substantially greater than the first width, the second dummy structure having second laterally opposed sidewalls;
    forming a third dummy structure concurrently with the first dummy structure, the third dummy structure having the first width, the third dummy structure having third laterally opposed sidewalls;
    depositing a first insulating material on the first laterally opposed sidewalls to form a first insulating spacer and a second insulating spacer;
    depositing a second insulating material on the second laterally opposed sidewalls to form a third insulating spacer and a fourth insulating spacer;
    depositing a third insulating material on the third laterally opposed sidewalls to form a fourth insulating spacer and a fifth insulating spacer;
    removing the first dummy structure;
    removing the second dummy structure;
    removing the third dummy structure; and
    performing an etch to form a first fin under the first insulating spacer, a second fin under the second insulating spacer, a third fin under the third insulating spacer, a fourth fin under the fourth insulating spacer, a fifth fin under the fifth insulating spacer, and a sixth fin under the sixth insulating spacer.

11. The method of claim 10, further comprising:
    forming a first pull-down field effect transistor (FET) using a first gate to modulate a first current through the first fin and through the second fin;
    forming a first pass-gate FET using a second gate to modulate a second current through the first fin and through the second fin in parallel with the first pull-down FET;
    forming a first pull-up FET using the second gate to modulate a third current through the third fin;
    forming a second pull-up FET using a third gate to modulate a fourth current through the fourth fin;
    forming a second pull-down FET using the third gate to modulate a fifth current through the fifth fin and through the sixth fin; and
    forming a second pass-gate FET using a fourth gate to modulate a sixth current through the fifth fin and through the sixth fin in parallel with the second pull-down FET.

12. The method of claim 10, further comprising removing at least a portion of at least one of the third fin and the fourth fin.

13. A method comprising:
    depositing, on a silicon substrate, a first dummy structure having a first sidewall and a second sidewall separated by a first width, wherein the first width is between 10 and 30 nanometers;

depositing, on the silicon substrate, a second dummy structure concurrently with depositing the first dummy structure, the second dummy structure having a third sidewall and a fourth sidewall separated by a second width, wherein the second width is between 40 and 70 nanometers;

depositing a first insulating material to form a first insulating spacer adjacent to the first sidewall and to form a second insulating spacer adjacent to the second sidewall;

depositing a second insulating material to form a third insulating spacer adjacent to the third sidewall and a fourth insulating spacer adjacent to the fourth sidewall;

removing the first dummy structure from the silicon substrate;

removing the second dummy structure from the silicon substrate; and removing a portion of at least one of the third insulating spacer and the fourth insulating spacer.

14. The method of claim 13, further comprising:

depositing contact pad structures over at least a portion of at least one of the first insulating spacer, the second insulating spacer, the third insulating spacer, and the fourth insulating spacer.

15. The method of claim 14, further comprising performing an etch using the first insulating spacer, the second insulating spacer, the third insulating spacer, and the fourth insulating spacer as etch masks to form a plurality of fins.

* * * * *